United States Patent [19]

Morozumi

[11] 4,063,114
[45] Dec. 13, 1977

[54] DYNAMIC DIVIDER CIRCUIT

[75] Inventor: Shinji Morozumi, Shimosuwa, Japan

[73] Assignee: Kabushiki Kaisha Suwa Seikosha, Tokyo, Japan

[21] Appl. No.: 594,402

[22] Filed: July 8, 1975

[30] Foreign Application Priority Data

July 8, 1974 Japan .................................. 49-78104

[51] Int. Cl.$^2$ ........................................... H03K 23/08
[52] U.S. Cl. ............................................. 307/225 C
[58] Field of Search ............ 307/220 C, 223 C, 224 C, 307/225 C, 226 C

[56] References Cited

U.S. PATENT DOCUMENTS

| 3,749,937 | 7/1973 | Rogers | 307/225 C |
| 3,829,713 | 8/1974 | Canning | 307/225 C |

FOREIGN PATENT DOCUMENTS 1,373,626  11/1974  United Kingdom ............. 307/225 C

OTHER PUBLICATIONS

"Codymos Freq. Dividers Achieve Low Power Consumption and High Freq." by Oguey et al., Electronic Letters, vol. 9, No. 17, 8/23/73.

Primary Examiner—Stanley D. Miller, Jr.
Attorney, Agent, or Firm—Blum, Moscovitz, Friedman & Kaplan

[57] ABSTRACT

A dynamic divider circuit for dividing a clock signal by $n$-1 where $n$ is an odd integer is provided. The divider circuit includes $n$-series connected C-MOS inverter circuits, the output of the last of the series-connected inverter circuits being coupled to the input of the first of the series-connected inverter circuits to define a closed loop. $n$-1 inverter circuits include first switching circuits coupled thereto, the remaining inverter circuit having a second switching circuit coupled thereto, each of the switching circuits being adapted to receive the clock pulse to be divided and produce at the output of each of the C-MOS inverter circuits the divided clock signal.

11 Claims, 7 Drawing Figures

DYNAMIC DIVIDER CIRCUIT

BACKGROUND OF THE INVENTION

This invention is directed to a dynamic divider circuit for dividing a clock signal by $n-1$, where $n$ is an odd integer, and in particular to a dynamic divider circuit having an even division ratio for dividing a single phase clock signal.

Heretofore, divider circuits admitting of an even division ratio have been primarily comprised of two-phase circuits. Such two-phase circuits receive a first input clock signal $\phi$ and a second clock pulse $\bar{\phi}$ having the same period but inverted with respect to the clock signal $\phi$. Nevertheless, because the oscillatory circuits for providing such clock signals produce a single phase signal, an inverter is disposed intermediate the oscillatory circuit and the divider circuit to produce the second phase clock signal. Although, such two-phase clock operation of the divider circuit at high frequencies is required to provide an accurate electronic wristwatch, same results in excessive current consumption, thereby shortening the life of the battery utilized to power the electronic wristwatch. Accordingly, a dynamic divider circuit having an even division ratio and admitting of single phase operation to reduce current consumption is desired.

SUMMARY OF THE INVENTION

Generally speaking, in accordance with the invention, a dynamic divider circuit for dividing a single phase binary clock signal applied thereto by $n-1$, where $n$ is an odd integer is provided. The divider circuit includes $n$ pairs of series-connected C-MOS inverter circuits, the output of the last of the series-connected inverter circuits being coupled to the input of the first of the series-connected inverter circuits to define a closed loop. First switching transistor circuits are coupled to $n-1$ inverter circuits, a second switching transistor circuit being coupled to the remaining inverter circuit, the first switching transistor circuits and second transistor circuit being adapted to receive the clock pulse and in response thereto produce said divided clock signal at the output of each of said inverter circuits.

It is an object of this invention to provide an improved dynamic divider circuit admitting of single phase operation.

A further object of this invention is to provide improved dynamic divider circuit having an even division ratio and admitting of single phase operation.

Still a further object of this invention is to provide a highly efficient dynamic divider circuit wherein current consumption is minimized thereby.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
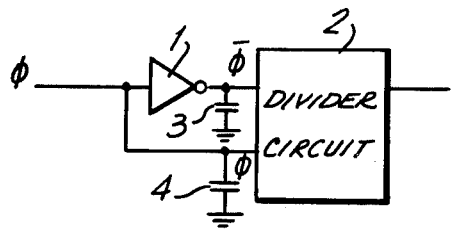
FIG. 1 is a circuit diagram of a two-phase divider circuit constructed in accordance with the prior art.

Referring now to FIG. 1, a two-phase dynamic divider circuit having an even division ration is depicted. A divider circuit 2 is adapted to receive a primary clock signal $\phi$ and a complementary clock signal $\bar{\phi}$ produced by applying primary clock signal $\phi$ to inverter circuit 1. Such a dynamic divider circuit is comprised of complementary coupled MOS transistors and the current consumption thereof is responsive to the thermal conductivity caused by the channel resistance of the MOS transistors resulting from the parasitic capacitance at each MOS transistor terminal as same is charged and discharged. The current consumption $i$ for such operation is represented as follows:

$$i = f \times C \times V$$

where $f$ is the operative frequency at which the dynamic divider circuit operates, $C$ is the parasitic capacitance of the respective MOS transistors and $V$ is the amplitude at which the dynamic divider circuit operates.

Figure 2:
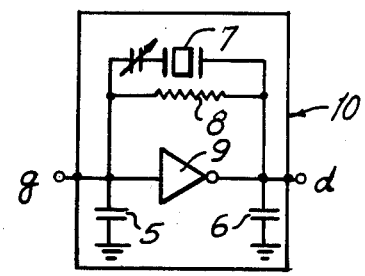
FIG. 2 is a circuit diagram of an oscillator circuit including an AT-cut quartz crystal time standard.

When a two-phase dynamic divider circuit 2 is utilized to produce a one-second signal, the current consumption of same does not exceed 1 $\mu$A if the frequency $(f)$ of the high frequency signal applied to the first stage of the dynamic divider circuit is on the order of 32 KHz, a frequency of such order of magnitude being representative of the middle range frequencies in an electronic wristwatch. However, in highly accurate electronic wristwatches utilizing quartz crystal oscillator circuits having an AT-cut quartz crystal vibrator as a time standard, the clock signal applied to the first stage of the dynamic divider circuit is on the order of several MHz. Such a quartz crystal oscillator circuit utilizing an AT-cut quartz crystal vibrator is illustrated in FIG. 2. When the frequency $(f)$ of the clock signal produced by the oscillator circuit is on the order of several MHz, current consumption increases by a magnitude of several times 10 $\mu$A and greater rendering such a dynamic divider circuit less than completely satisfactory for being integrated into a circuit chip for use in an electronic wristwatch. Accordingly, to reduce current consumption it is necessary to reduce the total parasitic capacitance (C) of the dynamic circuit if same is to be utilized in an electronic wristwatch.

The instant invention is directed to providing a dynamic divider circuit having an even division ratio and admitting of a single-phase operation. A first advantage which inures to a single-phase dynamic divider circuit having a single input clock pulse $\phi$ applied thereto is the elimination of an inverter circuit utilized to produce the complementary clock pulse $\bar{\phi}$. The elimination of the inverter circuit not only decreases current consumption caused thereby, but moreover eliminates the operational disadvantages inherent in two-phase operation. For example, the lack of synchronism between the respective phase signals $\phi$ and $\bar{\phi}$ thereby causing the accuracy of the divided signal to be less than certain is avoided. Similarly, the switching operation of the transistors comprising the dynamic divider circuit in response to the clock pulses applied thereto are simultaneously effected to provide more stable operation and allow improved frequency response to be obtained.

A further advantage to be derived by single-phase operation of a dynamic divider circuit is the direct coupling of same to a quartz crystal oscillator circuit of the type generally indicated as 10 in FIG. 2. The oscillator circuit in FIG. 2 comprises an AT-cut quartz crystal vibrator 7 coupled in parallel with a feed-back resistor 8 to the respective gate (g) and drain (d) terminals of C-MOS inverter-amplifier circuit 9 to produce a high frequency clock signal in the range of 1 MHz to 10 MHz. Capacitors 5 and 6 are respectively coupled to the gate input terminal (g) and the drain output terminal (d). Although the current consumption of the oscillator circuit depends on the values of the capacitors 5 and 6, by utilizing one further capacitor intermediate the oscillator circuit and a dynamic divider circuit constructed in accordance with the instant invention, a considerable reduction in the current consumption of the dynamic divider circuit results. Moreover, as is explained in greater detail below, because the gate input terminal (g) is operated at a reference potential which is above supply voltage, the operative speed of each of the switching transistors which comprise the dynamic divider circuit of the instant invention is increased providing a likewise increase in the responsive frequency of the divider circuit.

Figure 3:
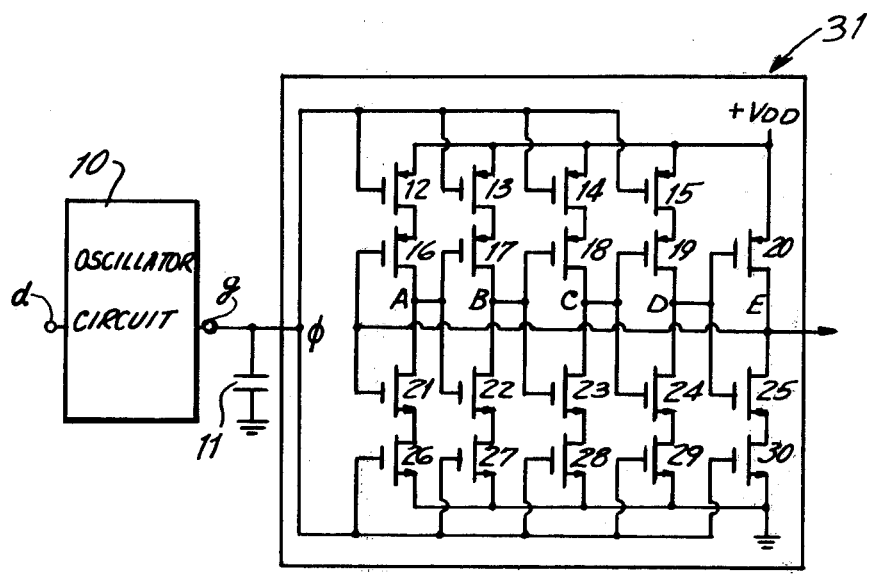
FIG. 3 is a circuit diagram of a ¼ dynamic divider circuit in combination with the oscillator circuit depicted in FIG. 2 and constructed in accordance with the instant invention.

Reference is now made to FIG. 3, wherein a ¼ dynamic divider circuit, generally indicated as 31, and constructed in accordance with the instant invention is depicted. The dynamic divider circuit 31 is adapted to receive a single phase clock pulse $\phi$ from oscillator circuit 10 and is coupled to the gate output terminal (g) thereof through capacitor 11, the capacitor 11 and respective gate and drain terminal capacitors 5 and 6 of the oscillator circuit 10 defining a predetermined equivalent capacitance for reducing the current consumption of the dynamic divider circuit 31.

The dynamic divider circuit 31 includes five series-connected inverter stages defined for purposes of discussion by their respective outputs A through E thereof. The inverter stages are comprised of P-channel insulated gate MOS transistors 16 through 20, respectively complementary coupled to N-channel insulated gate MOS transistors 21 through 25. The respective output terminals A through E defined by complementary coupled MOS transistors 16 through 20 and 21 through 25 coupled to the input of the next inverter stage, the output E of the last inverter stage defined by C-MOS transistors 20 and 25 being applied to the input of the first inverter stage defined by C-MOS transistors 16 and 21.

N-channel MOS switching transistors 26 through 30 are respectively series-connected by the gate electrodes thereof to N-channel MOS transistors 21 through 25. Each of the source electrodes of the N-channel MOS transistors 26 through 30 is commonly coupled to ground and each of the gate electrodes of N-channel transistors 26 through 30 are commonly coupled to the oscillator circuit 10 to receive the single-phase clock pulse $\phi$ applied thereto.

P-channel MOS switching transistors 12 through 15 are series connected at the drain electrode thereof to P-channel MOS transistors 16 through 19. The source electrodes of switching transistors 12 through 15 are coupled to a supply potential $+V_{DD}$ and the gate electrodes of switching transistors 12 through 15 are commonly coupled to the output drain terminal of the oscillator circuit 10 to receive the single phase clock pulses $\phi$ produced thereby. The source electrode of P-channel inverter transistor 20 is directly coupled to the supply potential $+V_{DD}$. The dynamic divider circuit 31 is therefore characterized by P-channel MOS transistor 20 being the only inverter stage transistor directly coupled at all times to the supply potential. Additionally, as is discussed in greater detail below with respect to the operation of the dynamic divider circuit 31, same is characterized by the respective parasitic capacitances of the MOS transistors at the respective output terminals A through E defining storage elements for holding a potential state to allow the divider circuit to admit of dynamic operation.

To better illustrate the operation of the instant invention, FIGS. 4 through 7 are equivalent circuit illustrations of the inverter stage defined by C-MOS transistors 16 through 21, the equivalent representations of the inverter C-MOS transistors 16 through 21 having like numerals followed by the letter a to illustrate same. Operation of the respective P-channel and N-channel transistors 12, 16, 21 and 26 in a switching mode is as follows. In response to a "1" potential being applied to the respective terminals $\phi$ and E, the respective P-channel transistors 12 and 16 are OFF and therefore define an opened circuit between the potential $+V_{DD}$ and output terminal A and the N-channel transistors 21 and 26, which transistors operate in a complementary symmetry mode, are OFF and define a closed current path between the output terminal A and ground. Alternatively, in response to the potential at $\phi$ and E being "0," both P-channel transistors 12 and 16 are respectively ON (closed), and N-channel transistors 21 and 26 are OFF (opened).

Figure 4:
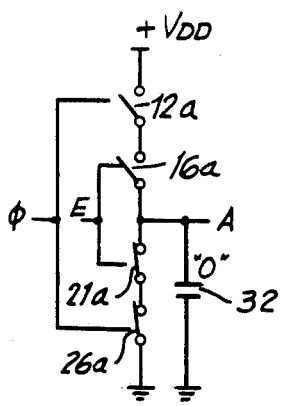
FIGS. 4 through 6 are equivalent circuit diagrams illustrating the operation of the dynamic divider circuit depicted in FIG. 3.

Referring specifically to FIG. 4, when the potential of the clock pulse $\phi$ is "1" and the input potential E from the last inverter stage is "1," transistor switches 12a and 16a are OFF and 21a and 26a are ON, thereby referencing output terminal A to ground through the respective transistors. The parasitic capacitance of the respective C-MOS elements is illustrated as a capacitor 32, and in response to referencing the output terminal A to ground effects a writing-in of a "0" at the output terminal A. In the next half cycle of the clock pulse $\phi$ illustrated in FIG. 5, the potential thereof is changed to "0" and the potential of the input terminal E remains at "1." Accordingly, switch 26a is turned OFF and switch 12a is turned ON. The output terminal A is not coupled to either the supply potential $+V_{DD}$ or the ground potential. Moreover, because the impedance produced by the opened switches 12a and 26a is on the order of 1,000 M-ohms or greater, the output terminal A continues to "float" and is maintained at "0" by the parasitic capacitance 32.

Figure 5:
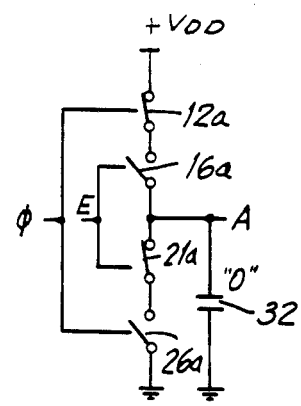
Figure 6:
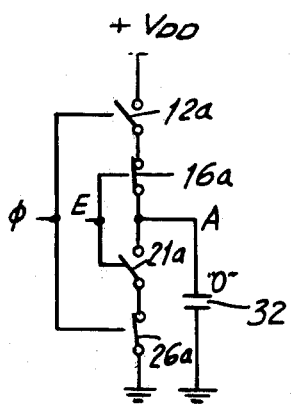

Referring now to FIG. 6, the next half-cycle of the clock pulse $\phi$, wherein $\phi$ is returned to a "1" potential, and coincident therewith, input terminal E is changed to a "0" potential, the potential at the output terminal A continues to be maintained floating with respect to the supply potential $+V_{DD}$ and ground and hence is maintained at "0" by the parasitic capacitance 32. As is more particularly illustrated in FIG. 7, in response to the next half-cycle of the clock pulse $\phi$, wherein $\phi$ is at a "0" potential and E is at a "0" potential, switches 12a and 16a are ON and therefore output terminal A is coupled to the supply voltage $+V_{DD}$ and hence produces a "1" at the output terminal thereof. In likewise manner, the potential at output terminal A will be maintained at "1" by parasitic capacitance 32 until N-channel transistors 21 and 26 are once again turned ON and output terminal A is thereby referenced to a ground potential. Although the operation illustrated in FIGS. 4 through 6 is directed to the first inverter stage, each of the series-connected inverter stages operates in the same manner to produce an output at the respective output terminals A through E, the output potential of each of the paired terminals being produced in response to the potential of the clock pulse at each half cycle thereof and the output potential of the next-previous inverter stage.

Figure 7:
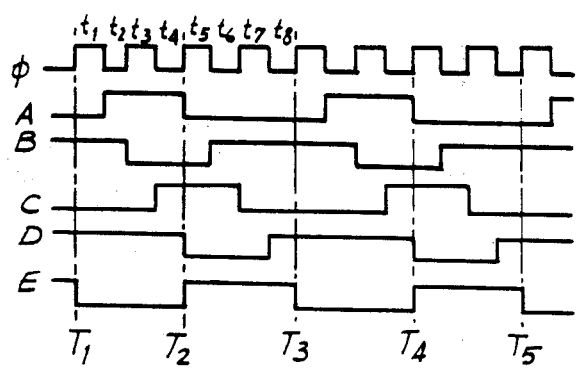
FIG. 7 is a wave diagram illustrating the operation of the dynamic divider circuit depicted in FIG. 3.

Referring specifically to FIG. 7, a wave diagram illustrating the output signal produced at each of the inverter stage output terminals A to E is illustrated. Thus, if the potential at the output terminal E is changed from a "0" to a "1" at a time $T_1$, the potential at output terminal A is maintained at "0" by the parasitic capacitance and by the "floating" of the output terminal A caused by the respective potentials applied to the transistors (E = 0 and $\phi$ = 1). At the second half-cycle of the clock pulse $t_2$, a "1" is written-in to the point A by means of the coincidence of the potentials at $\phi$ and E ($\phi$ = 0, E = 0). At the same moment, A = 1 and $\phi$ = 0 and the output terminal B is maintained at "1" by the parasitic capacitance. At the next half-cycle of the clock pulse $t_3$, a "0" is written-in to the output terminal B ($\phi$ = 1, A = 1). At the next half-cycle of the clock pulse $t_4$, the output terminals A and B are maintained at the same potential, and the output terminal C is changed in the same manner as described above with respect to the inverter stages having the output terminals A and B.

At the next half-cycle $t_5$ of the clock pulse $\phi$ when the potential at the output terminal D is changed from "1" to "0," the output terminal E is changed from "0" to "1" and is not held at "0" as in the previous inverter stages because of the absence of the switching transistor between P-channel transistor 20 and the supply potential $+V_{DD}$. Accordingly, since the potential at the output terminal E is changed to a "1" at the time $T_2$, terminal E is placed in the same or coincident binary state or potential as the clock pulse $\phi$ so that a "0" is thereby written-in at the point A. The $t_6$ and $t_7$ half-cycles of the clock pulse operate in the same manner indicated above the provide a half pulse delay to the next inverter stage output signal. During the last half-cycle of the clock pulse $t_8$, the N-channel side of the output terminal E becomes dependent on the clock pulse $\phi$ (E = 1, $\phi$ = 0) and a "0" is written-in to the output terminal E at the next half-cycle of the clock at time $T_3$ when the potentials of $\phi$ and D are the same ($\phi$ = 1, D = 1) and the output terminal E is thereby referenced to "0." Accordingly, the instant invention is characterized by a dynamic divider circuit capable of providing a ¼ divided signal having a 50% duty cycle at the point E between $T_1$ and $T_3$, and $T_3$ and $T_5$. A transition table illustrates the manner in which the dynamic divider circuit operates:

TRANSITION TABLE

| | $t_1$ | $t_2$ | $t_3$ | $t_4$ | $t_5$ | $t_6$ | $t_7$ | $t_8$ | | |
|---|---|---|---|---|---|---|---|---|---|---|
| $\phi$ | 1 | 0 | 1 | 0 | 1 | 0 | 1 | 0 | 1 | 0 |
| A | 0 | 1 | 1 | 1 | 0 | 0 | 0 | 0 | 0 | 1 |
| B | 1 | 1 | 0 | 0 | 0 | 1 | 1 | 1 | 1 | 1 |
| C | 0 | 0 | 0 | 1 | 1 | 1 | 0 | 0 | 0 | 0 |
| D | 1 | 1 | 1 | 1 | 0 | 0 | 0 | 1 | 1 | 1 |
| E | 0 | 0 | 0 | 0 | 1 | 1 | 1 | 1 | 0 | 0 |

It is noted that although ¼ divider circuit is illustrated by way of example, the instant invention is directed to a dynamic divider circuit capable of providing a division ratio of $1/(n-1)$, where $n$ is an odd integer, and hence the division is characterized by an even number.

Moreover, the same division ratio can be obtained at any of the output terminals of the inverter stages. Furthermore, the same or equivalent operation is effected if the P- and N-channel transistors are reversed, or in the alternative if the polarity of the supply potential is reversed.

Thus, the instant invention is directed to a dynamic divider circuit for effecting single-phase operation and yielding an even division ratio to render same particularly suited for use with a quartz crystal vibrator producing an output frequency of $2^n$. Moreover, the instant invention provides for a stable operation of the divider circuit at relatively low voltages and further requires minimum current to effect operation of same. It has been found that the larger the division ratio the greater the reduction in current consumption. For example for an oscillator for producing a clock pulse having a frequency of 4.194304 MHz having an AT-cut crystal vibrator utilizes 6 μA or less at an operating voltage of 1.5 volts.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A dynamic divider circuit for dividing a clock signal by $n-1$, where $n$ is an odd integer larger than 3, comprising $n$ series-connected C-MOS inverter stages, the output of the last of said series-connected inverter stages being coupled to the input of the first of said series-connected inverter stages to define a closed loop, first switching circuit means coupled to $n-1$ inverter stages, said first switching circuit means including $n-1$ pairs of first and second complementary switching transistor means, said first and second transistor means of each said pair being series coupled to said $n-1$ C-MOS inverter stages, and second switching circuit means coupled to the remaining inverter stage, said second switching circuit means including a further switching transistor means series coupled to said remaining inverter stage in the same manner that said first transistor means of each of said $n-1$ pairs is coupled to said inverter stages, said further switching transistor means being the same type of transistor means at said first transistor switching means series coupled to said $n-1$ pairs of first switching circuit means, said first and second switching circuit means in response to said clock signal being applied thereto controlling the switching of each said inverter stage to which both said switching means are respectively coupled to produce an output signal having a frequency equal to the frequency of the clock signal divided by $n-1$ at the output of each said inverter stage.

2. A dynamic divider circuit as claimed in claim 1, wherein each said C-MOS inverter stage includes a pair of complementary coupled P-channel and N-channel MOS transistors.

3. A dynamic divider circuit as claimed in claim 2, wherein the first transistor means of each of said pairs is series coupled to one of said N and P-channel transistors in each of said $n-1$ inverter stages, the second switching transistor means in each said pair being coupled to the other MOS transistor of each said inverter stage.

4. A dynamic divider circuit as claimed in claim 3, wherein said further transistor means is coupled to the one of said N-channel and P-channel transistors in said remaining inverter stage that said first transistor means of each said $n-1$ pairs is coupled.

5. A dynamic divider circuit as claimed in claim 4, and including potential supply means defining a first supply potential and a second ground potential, each of said first transistor means of said $n-1$ pairs of said further switching transistor being coupled to said ground potential, the second transistor means of said $n-1$ pairs and the MOS transistor of said remaining inverter stage not having a transistor switching means coupled thereto being coupled to said supply potential.

6. A dynamic divider circuit as claimed in claim 5, wherein each said transistor switching means is a MOS transistor operating in a switching mode, the switching electrode of each said transistor having said clock signal applied thereto.

7. A dynamic divider circuit for dividing a clock signal applied thereto comprising $n$ series-connected inverter stages, where $n$ is an odd integer larger than 3, the output of the last of said series-connected inverter stages being coupled to the input of the first of said series-connected inverter stages to define a closed loop connection therebetween, each of said inverter stages in response to said clock signal being applied thereto being disposed to produce an output signal, a first pair of switching transistors respectively coupled in series with said $n-1$ inverter stages so that said output signal produced by each of said $n-1$ inverter stages has a frequency equal to the clock signal divided by $n-1$ and inverted with respect to the output signal of said next-previous inverter stage, and a single switching transistor series coupled to the remaining inverter means so that said output signal produced by said remaining inverter means has a frequency equal to said clock signal divided by $n-1$, and the same duty cycle as said clock signal.

8. A dynamic divider circuit as claimed in claim 7, wherein each of said inverter stages includes a pair of P-channel and N-channel transistors, the respective drain electrodes of each pair of transistors being coupled to define an output terminal of each inverter stage, and the respective gate electrodes of each pair of MOS transistors is coupled to define the input terminal of each said inverter stage.

9. A dynamic divider circuit as claimed in claim 8, wherein said pair of switching transistors series-coupled to said $n-1$ inverter stages are a P-channel and N-channel MOS transistor, each of said P-channel transistors being series-coupled to said P-channel transistors defining said inverter pair, each said further N-channel transistor being series-coupled to said N-channel transistors defining said inverter pair, each of said pair of transistors having said clock signal applied thereto.

10. A dynamic divider circuit as claimed in claim 9, wherein said single switching transistor is coupled to said remaining inverter stage is a P-channel transistor series-connected to the P-channel MOS transistor of said inverter pair, the N-channel transistor of said inverter pair being directly coupled to each of said further N-channel transistors.

11. A dynamic divider circuit as claimed in claim 9, wherein said single switching transistor coupled to said remaining inverter stage includes a further N-channel MOS transistor series-coupled to said N-channel MOS transistor of said inverter pair, said P-channel transistor of said inverter pair being directly coupled to each of said further P-channel transistors.

* * * * *